(12) United States Patent
Kale et al.

(10) Patent No.: US 11,669,425 B2
(45) Date of Patent: Jun. 6, 2023

(54) COMPUTERIZED SYSTEM AND METHOD FOR PERIODICALLY POWERING UP A STORAGE DEVICE TO AVOID DATA LOSS

(71) Applicant: Micron Technology, Inc., Boise, ID (US)

(72) Inventors: Poorna Kale, Folsom, CA (US); Kishore Rao, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 263 days.

(21) Appl. No.: 16/843,562

(22) Filed: Apr. 8, 2020

(65) Prior Publication Data
US 2021/0318942 A1 Oct. 14, 2021

(51) Int. Cl.
*G06F 11/30* (2006.01)
*B60R 16/03* (2006.01)
*G11C 11/4076* (2006.01)
*G11C 11/4074* (2006.01)
*G11C 11/406* (2006.01)

(52) U.S. Cl.
CPC .......... *G06F 11/3058* (2013.01); *B60R 16/03* (2013.01); *G06F 11/3034* (2013.01); *G11C 11/4074* (2013.01); *G11C 11/4076* (2013.01); *G11C 11/40615* (2013.01)

(58) Field of Classification Search
CPC ... B60R 16/03; G11C 11/40615; G11C 16/30; G11C 5/144; G06F 11/3034; G06F 11/3058
See application file for complete search history.

(56) References Cited

U.S. PATENT DOCUMENTS

| | | | |
|---|---|---|---|
| 2004/0062119 A1* | 4/2004 | Stimak | G11C 11/406 365/222 |
| 2012/0263003 A1* | 10/2012 | Sakakibara | G11C 11/40618 365/222 |
| 2013/0154354 A1* | 6/2013 | Hayashi | B60R 16/03 307/9.1 |
| 2016/0225461 A1* | 8/2016 | Tuers | G11C 16/26 |
| 2019/0295666 A1* | 9/2019 | Parry | G11C 7/22 |
| 2020/0310910 A1* | 10/2020 | Saito | G06F 11/1068 |
| 2021/0196223 A1* | 7/2021 | Matsuda | A61B 6/4405 |

FOREIGN PATENT DOCUMENTS

| | | | | |
|---|---|---|---|---|
| CN | 104978217 A | * | 10/2015 | .......... B60L 3/0023 |
| EP | 3558754 B1 | * | 8/2021 | .......... B60R 16/03 |
| JP | 2006150997 A | * | 6/2006 | |
| JP | 2014178974 A | * | 9/2014 | |
| JP | 2020117063 A | * | 8/2020 | |

* cited by examiner

*Primary Examiner* — Vincent H Tran
(74) *Attorney, Agent, or Firm* — Greenberg Traurig

(57) ABSTRACT

Disclosed are devices and methods for periodically powering up a storage device(s) (SSDs) associated with a vehicle to avoid and prevent data loss. The disclosed embodiments provide mechanisms for preserving stored data collected during the running of a vehicle without requiring the main power supply to be routed through the CPU. Through the improved configuration and application of the disclosed power management integrated circuitry (PMIC), storage devices of a vehicle are enabled to be provided direct power and refreshed without powering on the vehicle (e.g., starting the car). The PMIC also ensures that the necessary power can be provided to and maintained to the storage device(s) in the event of an unexpected power loss.

20 Claims, 5 Drawing Sheets

COMPUTERIZED SYSTEM AND METHOD FOR PERIODICALLY POWERING UP A STORAGE DEVICE TO AVOID DATA LOSS

COPYRIGHT NOTICE

This application includes material that is subject to copyright protection. The copyright owner has no objection to the facsimile reproduction by anyone of the patent disclosure, as it appears in the Patent and Trademark Office files or records, but otherwise reserves all copyright rights whatsoever.

FIELD OF THE INVENTION

The disclosed embodiments are directed to in-vehicle computer systems and, in particular, to systems, devices and methods for improving the configuration and operation of a vehicle's power management integrated circuit (PMIC) system for managing the vehicle's storage devices to prevent data loss.

BACKGROUND

The disclosed embodiments are directed toward in-vehicle computing systems and, in particular, to devices and methods for improving the operation of memory of a vehicle.

A modern vehicle includes dozens of Electronic Control Units (ECUs), that are implemented to control the subsystems of a vehicle. Types of ECUs include, but are not limited to, engine control module (ECM), Powertrain Control Module (PCM), Transmission Control Module (TCM), Brake Control Module (BCM or EBCM), Central Control Module (CCM), Central Timing Module (CTM), General Electronic Module (GEM), Body Control Module (BCM), Suspension Control Module (SCM), control unit, or control module. The ECUs are coupled to storage devices (referred to as SSDs) that store and maintain data for the IVI, ADAS, driver monitor systems (DMSs) and other critical ECU functions. Such data can include, but is not limited to, data collected and processed from a sensor(s) on the vehicle (e.g., sensors located on the front/rear bumpers, side-view mirrors, control stick, windshield, and the like), environmental data, driver data (e.g., eye signals, head movements, and the like), and the like, or some combination thereof.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

The disclosed embodiments describe systems, devices, methods and non-transitory computer-readable media for periodically powering up SSDs associated with a vehicle to avoid and prevent data loss.

Most non-volatile memory operating on a vehicle requires frequent refresh under typical automotive high-temperature operating conditions. Existing refresh operations can only be performed when a vehicle is in operation and power is flowing from the power supply through the Central Processing Unit(s) (CPU(s)) to the storage devices and the other electrical components of the vehicle. That is, for example, under current protocols, storage devices (e.g., solid state drives (SSDs)) of vehicles are only provided power when the vehicle is "turned" on and the power is channeled through the CPU to the SSDs. It is only during these periods are the storage devices of the vehicle capable of performing refresh operations.

Therefore, under existing protocols and configurations, when the vehicle is not in operation, or running for an extended period of time, the storage devices are not able to perform necessary refresh operations, which could, and often does, result in loss of data.

The disclosed embodiments provide mechanisms for remedying existing shortcomings with respect to the way the integrated circuitry within a vehicle is configured and operates. The disclosed mechanisms are configured for preserving stored data collected during the running of a vehicle without requiring the main power supply (or an auxiliary power supply) to be routed through the CPU. This, effectively, enables the SSDs of a vehicle to be provided power for a data refresh operation without powering-on the entire vehicle (e.g., starting the car); and also ensures that the necessary power can be provided to and maintained to the SSDs in the event of an unexpected power loss.

The disclosed configuration of the power set-up and manner in which voltage (both in a linear and switch mode, for example) propagates through the vehicles components requires a modification to the power management integrated circuit (PMIC) system in a vehicle, as discussed below in relation to FIG. 5. The disclosed mechanisms and power configuration(s) enable the periodic supply of power to storage devices in a vehicle so the storage device can perform necessary refresh operations to avoid loss of data. For example, in some embodiments, the disclosed framework provides an efficient means for a vehicle electronic system to periodically power up storage devices built with NAND/3DXPT/RRAM so the storage devices can perform refresh operations. As discussed herein, this can be performed efficiently without having to the power up the entire system (e.g., the CPU), and rather have the charge sent from the power supply directly to the SSDs.

Figure 5:
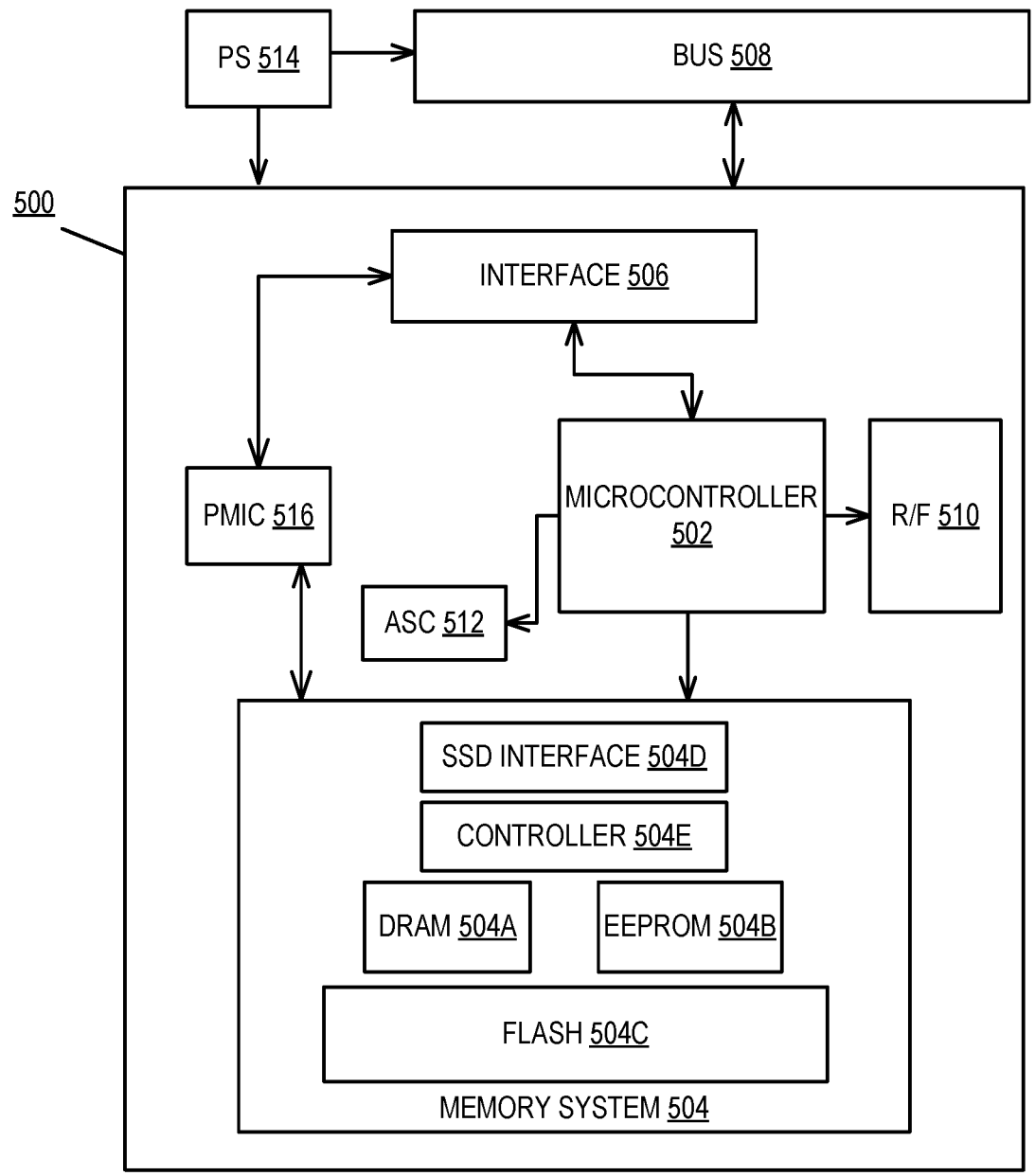
FIG. 5 is a block diagram of an ECU according to some embodiments of the instant disclosure.

According to some embodiments, the improved PMIC is situated between a power supply and a storage device (e.g., SSD), as illustrated in FIG. 5 discussed below. It includes a power switch with certain logic of powering up/down sequences. In some embodiments, the PMIC may have a timer that wakes itself up, then switches on the power to the SSD without switching on the power to the CPU (or other electronical component within the vehicles ECU). Thus, the SSD can receive its power directly from the power supply.

Moreover, according to some embodiments, after receiving power directly from the power supply, the SSD runs a quick scan and performs refresh operation if needed, as discussed below. The PMIC then switches off the power to the storage device after a predetermined time (e.g., 10 mins). The PMIC can repeat the cycle again after a preset duration (as long as it has sufficient battery charge).

Thus, the disclosed systems and methods circumvent involving power hungry CPUs (or other electronic components of a vehicle) from receiving power when initiating refresh operations on storage devices. This avoids a large battery drain for unnecessarily powering up the entire system to allot power to storage/memory. It also lowers the probability for data loss in a storage device(s) to occur.

Certain embodiments will now be described in greater detail with reference to the figures.

Figure 1:
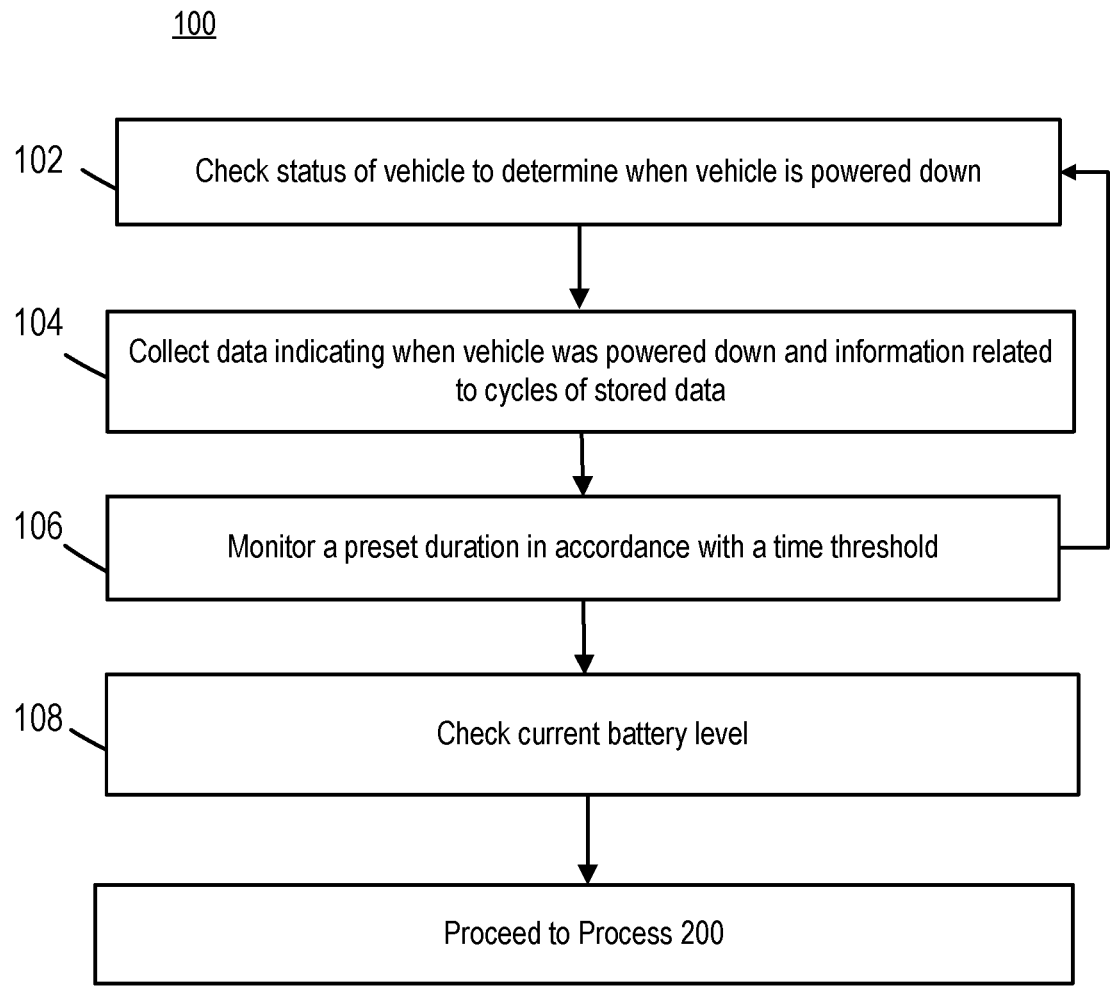
FIG. 1 is a flow diagram illustrating a method for monitoring a power supply of a vehicle according to some embodiments of the disclosure.

FIG. 1 is a flow diagram illustrating the monitoring a power supply of a vehicle (100) according to some embodiments of the disclosure. As evident from the discussion below in relation to at least FIGS. 2 and 3, the monitoring of the power supply enables the disclosed PMIC to determine when and how to directly provide power to storage devices of a vehicle's system for the performance of refresh operations.

In block 102, the status of a vehicle is checked in order to determine when the vehicle was/is powered down. The initiation of the checking in Block 102 can be triggered automatically based on a number of factors, including, but not limited to, a predetermined time period, the power level of the power supply, collected environmental data (e.g., detection that the vehicle is parked in a garage), user input, and the like, or some combination thereof. In some embodiments, the PMIC can have a timer that wakes itself to perform a check of the status of the vehicle that provides an indication of its power status.

According to some embodiments, Block 102 involves analyzing the power logs or data associated with a power supply to determine a voltage reading. The voltage reading data can indicate when the system was powered down, or the current power levels. The current power data can provide an indication that the device is currently in use, when it was last in use and the current power cycle, if any, being processed through the vehicle 400 (as discussed below in relation to FIG. 4).

In some embodiments, the analysis performed during Block 102 can be directed towards an AI processing unit (e.g., a ADAS unit) of a device to determine if the vehicle is currently in use. Should it be determined that the AI unit is idle, then a power check can be performed to determine if the device is on.

In Block 104, based on the analysis performed in Block 102, the power data analyzed is collected and stored. The power data indicates when the vehicle was last turned on (e.g., and/or when it was last turned off, or its current state), and such data is stored in the vehicle's SSD (e.g., non-volatile memory see, e.g., item 408 of FIG. 4 and item 504c of FIG. 5).

In some embodiments, Blocks 102-104 can be implemented using an integrated circuit configuration of a low-power timer. Such configuration can utilize a timer, pulse generation and/or CMOS timer to determine a voltage level that indicates a device is powered down and/or when such voltage reduction occurred.

In Block 106, a determination is made regarding how much time has passed since the vehicle was turned off/powered-down (e.g., when the ignition switch, starter switch or start switch in the control system of a motor vehicle is in an off position, after keys to the vehicle has been removed from the vehicle, and/or after the doors of the vehicles are locked without a mechanical key being in the ignition switch and/or without a wireless key being positioned inside the vehicle). This determination can involve monitoring the vehicle and its power data, and after a threshold satisfying amount of time has passed (e.g., 1 week) where the device has not been powered up, the operation of Block 108 is performed. In some embodiments, should the device be turned on during the monitoring of Block 106, the operation of Block 102 is performed.

In Block 108, the current battery level of the vehicle is checked. In some embodiments, this can involve pinging the vehicle's power source (e.g., battery) via an algorithm or device (e.g., DMM, DVOM) that performs multimeter functionality, detects a current running through the vehicle's components, and determines a range of voltage the source is currently operating at. For example, fully charged automotive batteries typically measure at 12.6 volts or higher. When the engine is running, this measurement is typically between 13.7 to 14.7 volts. In some batteries, when it is below 11.8 volts, the battery is considered to be completely discharged.

It should be understood that the above voltage readings are for illustrative purposes only, as the current PMIC configuration and processing can be utilized for any type of power source or battery configuration, whether known or to be known, and the operation will remain the same. The readings of the power data can vary, and how such variations impact how power is produced to/within the vehicle will not limit how the disclosed PMIC functionality operates. Thus, should a battery, for example, operate at various levels when producing power or when it is discharged, the disclosed systems and methods are capable of adapting to these standards.

Figure 2:
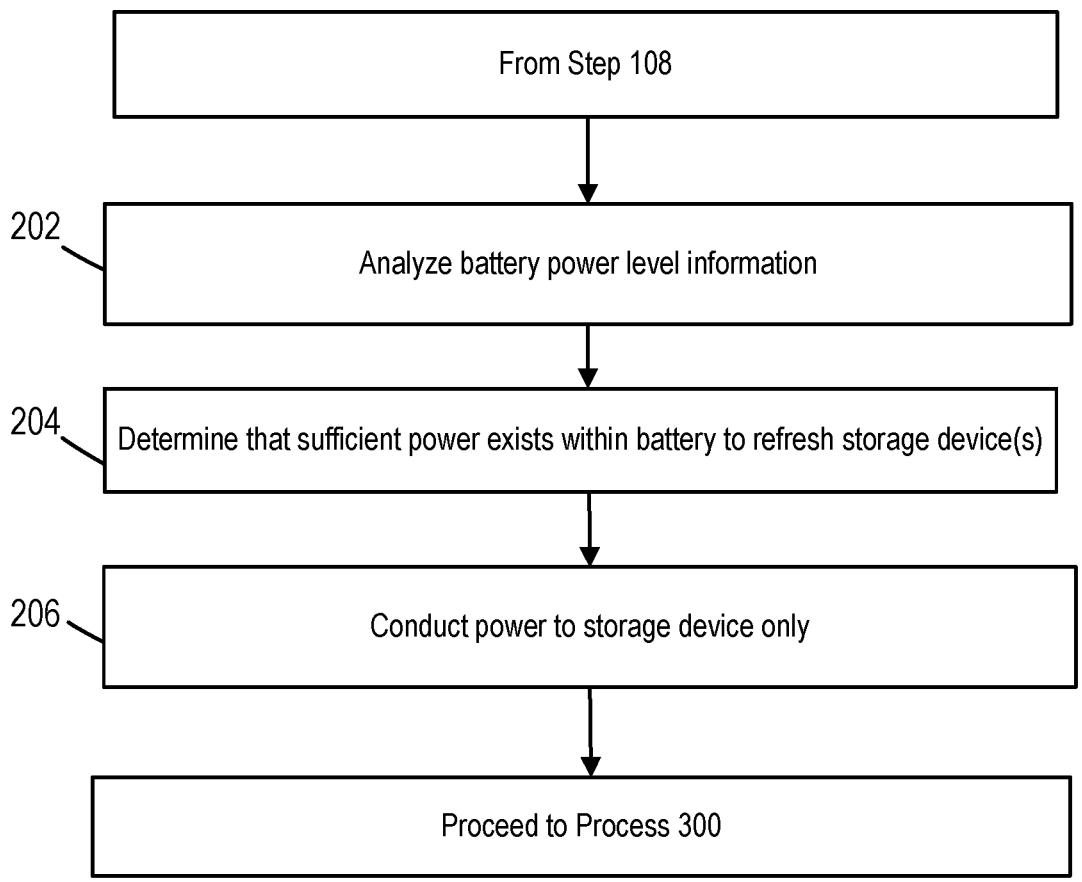
FIG. 2 is a flow diagram illustrating a method for managing power within a vehicle system according to some embodiments of the instant disclosure.

The check performed in Block 108 is for purposes of determining how much power is available to send to the storage device(s), and determining if it is sufficient for performing a refresh operation, as discussed in relation to FIG. 2 below. In the method of FIG. 2, the availability of sufficient power for refreshing storage device(s) is checked; and if sufficient power is available, the storage device(s) can be provided with power without powering up the entire computer system in the vehicle.

In Block 202, after retrieving, identifying, determining or otherwise checking the current levels of the power source, as in Block 108, the battery/power data currently available from the power source is analyzed. As discussed above, this can involve analyzing the current voltage available for discharging from the battery of the vehicle.

In Block 204, a determination is made regarding whether sufficient power (e.g., charge) exists within the battery to be routed directly to the storage device(s) for performing a refresh operation. This determination is based on a comparison to a charge threshold, such that the existing charge in the battery is compared to a charge threshold that ensures that a refresh operation is capable of being performed via a minimal amount of charge, and should the existing charge satisfy the charge threshold, the operation of Block 206 is performed.

In Block 206, at least a portion of the power (e.g., the sufficient amount as discussed in Block 204 above) existing in the battery is directly conducted (or sent) to only the storage device(s) of the vehicle. Such power facilitation involves by-passing the CPU and other components and sending it directly to the storage device(s) (see FIG. 5 discussed below, which illustrates a PMIC 516 operating between the power supply 514 and the memory 504). Thus, rather than powering up the entire electronic system of the vehicle, only the SSDs are in reception of power during a refresh operation.

Figure 3:
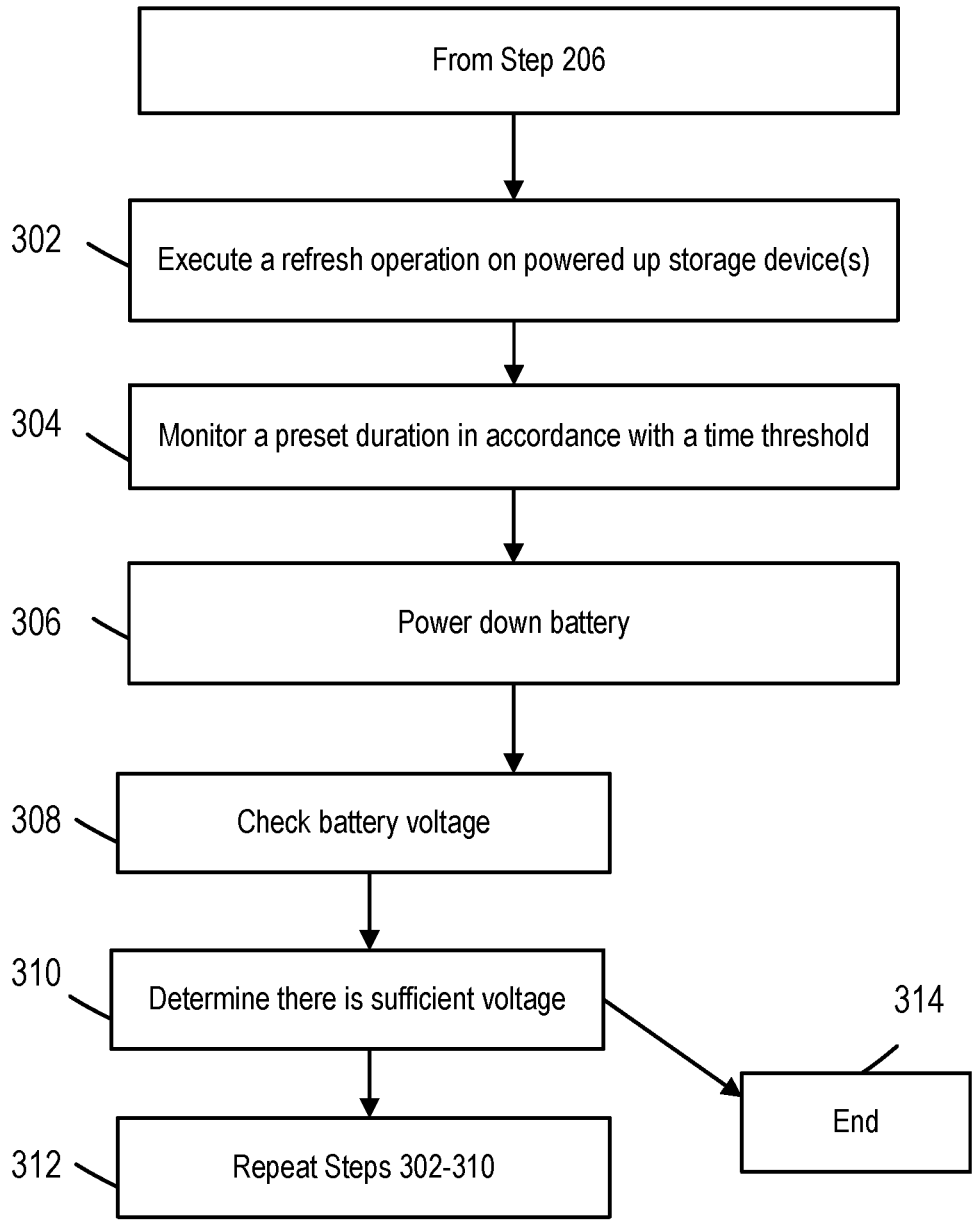
FIG. 3 is a flow diagram illustrating a method for refreshing a storage device according to some embodiments of the instant disclosure.

Upon sending the power to the storage device in Block 206, a refresh operation is performed, as discussed below in relation to FIG. 3. Details of operations performed for refreshing a storage device are shown in FIG. 3.

In Block 302, a refresh operation(s) is performed on the power-supplied storage device(s) of the vehicle. A refresh operation can involve reading the data from a memory cell that has been previously programmed (written into), and writing that data into another memory cell. The refresh operation then updates the address map of the SSD to indicate the new location of the data. In some embodiments, the previous memory cell would be marked as having "garbage" so that its storage capacity can be reclaimed in a garbage collection operation.

According to some embodiments, a refresh operation can involve triggering a file refresh for not only the SSD but also the file system where the repository is hosted. The performed operations can be a full file system refresh or a partial file system refresh, and can be any type of known or to be known operation, including, but not limited to, for example, a burst refresh, RAS only refresh, Distributed refresh, CAS before RAS refresh (CBR), Hidden refresh, and the like, or some combination thereof. The type of refresh operation performed can be based on the amount of power available, as such operations can be resource- and time-consuming operations.

Having performed the refresh operation, the operation of Block 304 is performed where a period of time is monitored, and after a threshold amount of time has passed since the refresh (e.g., since the refresh operation began or since it concluded, which can depend on the type of operation and/or the amount of power available to the battery or sent to the storage device(s)), the power supplied to the storage device (s) is halted (e.g., the power is turned off). Block 306. Thus, for example, after a predetermined period of time (e.g., 10 minutes) the power supply to the storage device(s) is turned off.

After power down in Block 306, the amount of power remaining is checked. Block 308. This check analyzes the charge remaining in the battery after the voltage discharge from the refresh operation.

In Block 310, a determination is made regarding whether there is sufficient charge in the battery to perform another refresh operation. The determination in Block 310 is performed after a preset duration, which allots for more data to be have been collected, or an amount of time where another refresh operation would increase the integrity of the data in storage.

If it is determined in Block 310 that the battery has sufficient charge, the operation of Block 312 is performed which initiates the performance of Blocks 302-310 again, as discussed above. If there is not sufficient charge, the operations end/halt. Block 314.

Figure 4:
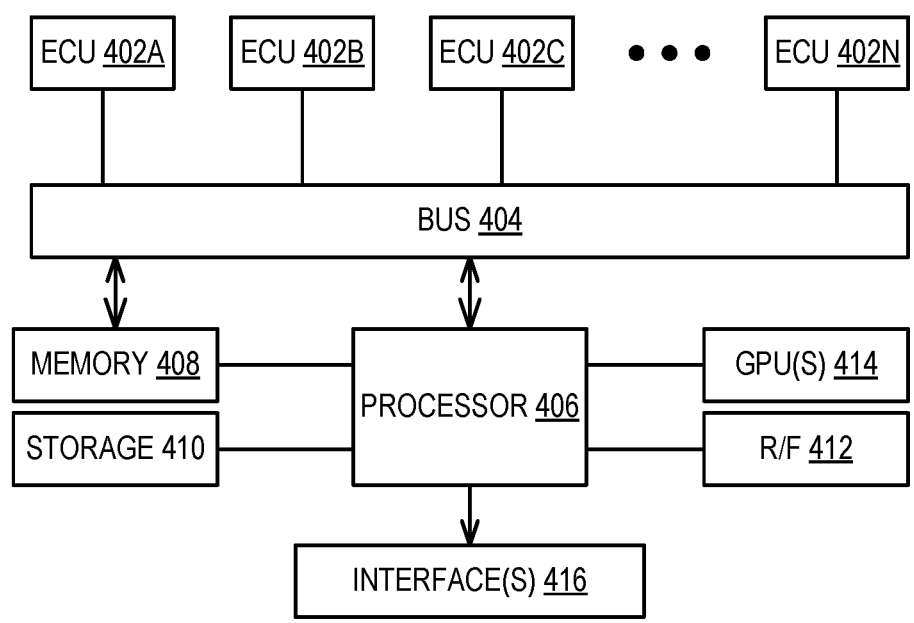
FIG. 4 is a block diagram illustrating a vehicle network according to some embodiments of the instant disclosure.

FIG. 4 is a block diagram illustrating a vehicle configuration according to some embodiments of the disclosure. In FIG. 4, a vehicle (400), embodied as a data concentrator and power distributor system, can include any type of vehicle (e.g., automobile, boat, etc.). Generally, a vehicle can include any superstructure housing various discrete computing systems and a vehicle is provided as an example.

Vehicle (400) includes one or more ECUs (402a-402n). Examples of ECUs include door control unit (DCU), engine control unit, electric power steering control unit (PSCU), human-machine interface (HMI), powertrain control module (PCM), seat control unit, speed control unit (SCU), telematic control unit (TCU), transmission control unit (TCU), brake control module (BCM; ABS or ESC), or battery management system (BMS) devices. While described primarily in the context of ECU devices, any type of embedded computing system may be used in the embodiments disclosed herein and embodiments referencing ECU devices are provided as examples. An exemplary configuration of an ECU is provided in FIG. 5, and that discussion is not repeated herein.

ECUs (402a-402n) are each connected to a bus (404). In some embodiments, the bus (404) includes a CAN Bus, FlexRay MOST bus, or any other type of bidirectional communication bus.

The processing side of the system includes one or more processors (406), short-term memory (408), an RF system (412), graphics processing units (GPUs) (414), long-term storage (410) and one or more interfaces (418).

The one or more processors (406) may include central processing units, FPGAs, or any range of processing devices needed to support the operations of the autonomous vehicle. The processor (406) can function as an ECU on bus 404.

Memory (408) includes DRAM or other suitable volatile RAM for temporary storage of data required by processors (406). RF system (412) may include a cellular transceiver and/or satellite transceiver. Long-term storage (410) may include one or more high-capacity solid-state drives (SSDs). In general, long-term storage (410) may be utilized to store, for example, high-definition maps, routing data, and any other data requiring permanent or semi-permanent storage. GPUs (414) may include one more high throughput GPU devices for processing data received from other vehicle subsystems. Finally, interfaces (416) may include various display units positioned within the vehicle (e.g., an in-dash screen). In the illustrated embodiment, the memory (408) and/or storage (410) includes pre-booting software configured to execute the methods described previously.

FIG. 5 is a block diagram of an ECU according to some embodiments of the disclosure.

In the illustrated embodiment, an ECU (500) is communicatively coupled to a bus (508) via an interface (506). As discussed above, the bus (508) may include a CAN, FlexRay, MOST bus or similar type of bus. Correspondingly, the interface (506) may include a similar interface for accessing the specific type of bus used. Interface (506) is also configured to receive power (e.g., voltage, current, and other forms of power signals and data) from the power supply (514), as discussed below.

The ECU (500) additionally includes a microcontroller (502), R/F subsystem (510), application-specific components (ASC) (512), power supply (PS) 514, PMIC 516 and memory system (504).

In the illustrated embodiment, the microcontroller (502) can include a processor or smaller microcontroller configured to control operations of the ECU (500). In some embodiments, the microcontroller (502) accesses program instructions stored in the memory system (504) and, according to those instructions, drives ASC (512). Examples of ASC (512) include actuators for door controls, display units for infotainment ECUs, transmission control devices for TCUs, and various other controls. The types of ASCs employed by the ECU (500) are not limiting and any type of ASCs may be employed by the ECU (500).

ECU (500) additionally includes an R/F system (510). In the illustrated embodiment, the R/F system (510) may include one or more radios or transceivers for communicating with wireless networks. R/F system (510) may include Bluetooth, Wi-Fi or cellular radios or satellite transceivers. In some embodiments, R/F system (510) includes a combination of radios or transceivers. In some embodiments, ECU (500) may not include an R/F system (510) and may instead utilize a vehicle-wide R/F system, as described previously.

The ECU (500) further includes PMIC (516), which manages memory system (504). The PMIC (516) controls or manages the transmission of power routed from the PS (514) to memory (504).

In the illustrated embodiment, memory system (504) includes DRAM (504a), electrically erasable programmable read-only memory (EEPROM) (504b) and Flash storage (504c).

Memory system (504) also includes SSD interface (504d) and controller (504e). As discussed herein, interface (504d) is configured for receiving instructions from the PMIC (516) (and in some embodiments exclusive refresh operations, from microcontroller (502)). Controller (504e) is programmed via firmware to perform maintenance operations, such as, but not limited to, wear leveling, garbage collection, refleshing, and the like.

As discussed above in relation to FIGS. 1-3, the supply of power to memory (504) is managed and facilitated by the PMIC (516) during refresh operations.

According to embodiments of the instant disclosure, a charge from PS (514) is received in by the ECU (500) via interface (502). This charge is then relayed to the PMIC (516), which as discussed above is a power switch with certain logic of managing powering up/down sequences of memory (504). The PMIC (516) enables power to flow directly to the memory (504) from the PS (514), which avoids the CPU (e.g., microcontroller (502) or other components associated with the electrical components of the vehicle) from receiving power during refresh operations (100-300).

The PMIC (516) then relays the received power to the memory (504), which is received by SSD interface (504d). The interface (504d) communicates the power to SSD controller (504e) which controls the refresh operations therein (e.g., 302). Thus, the SSD controller (504e) is effectively be powered up for a refresh operation (while, for such refresh operation, the microcontroller (502) is not).

In the illustrated embodiment, Flash (504c) includes the primary non-volatile and long-term storage of the ECU (500). Flash (504c) may include single-level NAND Flash, multiple-level cell NAND Flash, or any other type of Flash architecture. Alternatively, or in conjunction with the foregoing, Flash (504c) may be replaced or supplemented with hard disk (magnetic) storage. In general, Flash (504c) stores all data used by the ECU (500) including an operating system. The memory system (504) additionally includes EEPROM (504b) which stores firmware and other infrequently modified data (e.g., boot settings etc.).

Memory system (504) includes DRAM (504a). DRAM (504a) can include any type of DRAM (504a) that provides volatile storage for ECU (500) and the disclosure is not limited to the specific arrangement of DRAM used by DRAM (504a). The operating system also periodically receives reports from DRAM (504a) regarding the memory usage of active processes. These statistics are stored in Flash (504c) for later use, as described previously.

The power supply (514) can include a power converter that converts a baseband power supply (not depicted) to voltages and currents required by all components of the ECU (500). In some embodiments, power supply (514) may include multiple discrete power sources (e.g., external power, battery power, and the like).

In the illustrated embodiment, power supply (514) can power each of the components illustrated. As discussed above in operations 100-300, for a refresh operation, PS (514) can power the memory (504) directly through the PMIC (516). For other (non-refresh) operations, power can be relayed via microprocessor (502). Further, power supply (514) can be configured to selectively disable and enable power to each component. For example, the methods of FIGS. 1 to 3 can be implemented in the PMIC (516), the storage (410), and/or the memory system (504) without powering up the processor (406), the GPU(s) (414), the ASC (512), and/or the microcontroller (502).

The present disclosure is described fully above with reference to the accompanying drawings, which form a part hereof, and which show, by way of non-limiting illustration, certain example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present disclosure has been described above with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a processor of a general purpose computer to alter its function as detailed herein, a special purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

For the purposes of this disclosure a non-transitory computer readable medium (or computer-readable storage medium/media) stores computer data, which data can include computer program code (or computer-executable instructions) that is executable by a computer (e.g., as illustrated in FIG. 4 and/or FIG. 5), in machine readable form. In some implementations, the operations performed by the PMIC (516) can be implemented via a microcontroller or microprocessor executing instructions (e.g., microcode) without a CPU running an operating system and/or application programs. By way of example, and not limitation, a computer readable medium may include computer readable storage media, for tangible or fixed storage of data (e.g., 408, 410, and/or 504), or communication media for transient interpretation of code-containing signals. Computer readable storage media, as used herein, refers to physical or tangible storage (as opposed to signals) and includes without limitation volatile and non-volatile, removable and non-removable media implemented in any method or technology for the tangible storage of information such as computer-readable instructions, data structures, program modules or other data. Computer readable storage media includes, but is not limited to, RAM, ROM, EPROM, EEPROM, flash memory or other solid state memory technology, CD-ROM, DVD, or other optical storage, cloud storage, magnetic cassettes, magnetic tape, magnetic disk storage or other magnetic storage devices, or any other physical or material medium which can be used to tangibly store the desired information or data or instructions and which can be accessed by a computer or processor.

For the purposes of this disclosure a module is a software, hardware, or firmware (or combinations thereof) system, process or functionality, or component thereof, that performs or facilitates the processes, features, and/or functions described herein (with or without human interaction or augmentation). A module can include sub-modules. Software components of a module may be stored on a computer readable medium for execution by a processor. Modules may be integral to one or more servers, or be loaded and executed by one or more servers. One or more modules may be grouped into an engine or an application.

Those skilled in the art will recognize that the methods and systems of the present disclosure may be implemented in many manners and as such are not to be limited by the foregoing exemplary embodiments and examples. In other words, functional elements being performed by single or multiple components, in various combinations of hardware and software or firmware, and individual functions, may be distributed among software applications at either the client level or server level or both. In this regard, any number of the features of the different embodiments described herein may be combined into single or multiple embodiments, and alternate embodiments having fewer than, or more than, all of the features described herein are possible.

Functionality may also be, in whole or in part, distributed among multiple components, in manners now known or to become known. Thus, myriad software/hardware/firmware combinations are possible in achieving the functions, features, interfaces and preferences described herein. Moreover, the scope of the present disclosure covers conventionally known manners for carrying out the described features and functions and interfaces, as well as those variations and modifications that may be made to the hardware or software or firmware components described herein as would be understood by those skilled in the art now and hereafter.

Furthermore, the embodiments of methods presented and described as flowcharts in this disclosure are provided by way of example in order to provide a more complete understanding of the technology. The disclosed methods are not limited to the operations and logical flow presented herein. Alternative embodiments are contemplated in which the order of the various operations is altered and in which sub-operations described as being part of a larger operation are performed independently.

While various embodiments have been described for purposes of this disclosure, such embodiments should not be deemed to limit the teaching of this disclosure to those embodiments. Various changes and modifications may be made to the elements and operations described above to obtain a result that remains within the scope of the systems and processes described in this disclosure.

What is claimed is:

1. A method comprising:
   identifying, via a computing device, a status of a power supply associated with the computing device, the status indicating when the computing device was powered down;
   analyzing, via the computing device, current power data of the power supply, the analyzing of the current power data comprising determining a current charge of the power supply;
   determining, via the computing device, that the current charge is sufficient for performing a refresh operation of a storage device associated with the computing device, wherein the refresh operation comprises reading data from a first memory cell of the storage device and writing the data to a second memory cell of the storage device;
   providing, via the computing device, via the power supply, a charge directly to the storage device, the providing comprising facilitating a transfer of power directly between the power supply and the storage device, wherein the providing the charge directly to the storage device involves bypassing at least one other componentry of the computing device when conducting the charge to the storage device;
   executing, via the computing device, based on the provided charge, the refresh operation on the storage device; and
   updating, during execution of the refresh operation, an address map of the storage device to indicate that the second memory cell serves as a new location for the data.

2. The method of claim 1, further comprising:
   monitoring a time period associated with the execution of the refresh operation;
   determining, based on the monitoring, that the time period satisfies a threshold, the threshold corresponding to a preset amount of time since a refresh operation; and
   powering down the storage device.

3. The method of claim 1, further comprising: analyzing a remaining charge in the power supply after the executed refresh operation; and determining that the remaining charge is sufficient to perform another refresh operation.

4. The method of claim 3, further comprising: executing the another refresh operation.

5. The method of claim 3, wherein the charge analysis is performed after a predetermined period of time beginning with an end of the refresh operation.

6. The method of claim 1, further comprising: storing, in non-volatile memory associated with the computing device, the status.

7. The method of claim 1, further comprising:
monitoring a time period beginning upon the identification of the status; and
determining, based on the monitoring, that the time period satisfies a threshold, the threshold corresponding to an amount of time the computing device has not received power from the power supply.

8. The method of claim 7, wherein the current charge determination is based on the time period determination.

9. The method of claim 1, wherein the current charge determination comprises: comparing the current charge to a charge threshold, the charge threshold corresponds to a charge that ensures that a refresh operation is capable of being performed.

10. The method of claim 1, wherein the computing device is a vehicle.

11. The method of claim 1, wherein the power supply is a battery associated with the vehicle.

12. A non-transitory computer-readable storage medium tangibly encoded with computer executable instructions, that when executed by a processor of a computing device, perform a method comprising:
identifying, via the computing device, a status of a power supply associated with the computing device, the status indicating when the computing device was powered down;
analyzing, via the computing device, current power data of the power supply, the analyzing of the current power data comprising determining a current charge of the power supply;
determining, via the computing device, that the current charge is sufficient for performing a refresh operation of a storage device associated with the computing device, wherein the refresh operation comprises reading data from a first memory cell of the storage device and writing the data to a second memory cell of the storage device;
providing, via the computing device, via the power supply, a charge directly to the storage device, the providing comprising facilitating a transfer of power directly between the power supply and the storage device, wherein the providing the charge directly to the storage device involves bypassing at least one other componentry of the computing device when conducting the charge to the storage device;
executing, via the computing device, based on the provided charge, the refresh operation on the storage device; and
updating, during execution of the refresh operation, an address map of the storage device to indicate that the second memory cell serves as a new location for the data.

13. The non-transitory computer-readable storage medium of claim 12, further comprising:
monitoring a time period associated with the execution of the refresh operation;
determining, based on the monitoring, that the time period satisfies a threshold, the threshold corresponding to a preset amount of time since a refresh operation; and
powering down the storage device.

14. The non-transitory computer-readable storage medium of claim 12, further comprising:
analyzing a remaining charge in the power supply after the executed refresh operation;
determining that the remaining charge is sufficient to perform another refresh operation; and
executing the another refresh operation.

15. The non-transitory computer-readable storage medium of claim 14, wherein the charge analysis is performed after a predetermined period of time beginning with an end of the refresh operation.

16. The non-transitory computer-readable storage medium of claim 12, further comprising:
storing, in non-volatile memory associated with the computing device, the status.

17. The non-transitory computer-readable storage medium of claim 12, further comprising:
monitoring a time period beginning upon the identification of the status; and
determining, based on the monitoring, that the time period satisfies a threshold, the threshold corresponding to an amount of time the computing device has not received power from the power supply, wherein the current charge determination is based on the time period determination.

18. The non-transitory computer-readable storage medium of claim 12, wherein the current charge determination comprises:
comparing the current charge to a charge threshold, the charge threshold corresponds to a charge that ensures that a refresh operation is capable of being performed.

19. A computing device comprising:
a processor; and a non-transitory computer-readable storage medium tangibly encoded with program logic, the program logic comprising: logic executed by the processor for identifying a status of a power supply associated with the computing device, the status indicating when the computing device was powered down;
logic executed by the processor for analyzing current power data of the power supply, the analyzing of the current power data comprising determining a current charge of the power supply;
logic executed by the processor for determining that the current charge is sufficient for performing a refresh operation of a storage device associated with the computing device, wherein the refresh operation comprises reading data from a first memory cell of the storage device and writing the data to a second memory cell of the storage device;
logic executed by the processor for providing via the power supply, a charge directly to the storage device, the providing comprising facilitating a transfer of power directly between the power supply and the storage device, wherein the providing the charge directly to the storage device involves bypassing at least one other componentry of the computing device when conducting the charge to the storage device;
logic executed by the processor for executing based on the provided charge, the refresh operation on the storage device; and
logic executed by the processor for updating, during execution of the refresh operation, an address map of the storage device to indicate that the second memory cell serves as a new location for the data.

20. The computing device of claim 19, further comprising:
- logic executed by the processor for analyzing a remaining charge in the power supply after the executed refresh operation;
- logic executed by the processor for determining that the remaining charge is sufficient to perform another refresh operation; and
- logic executed by the processor for executing the another refresh operation.

\* \* \* \* \*